United States Patent [19]

Jove et al.

[11] Patent Number: 5,204,789

[45] Date of Patent: Apr. 20, 1993

[54] LOW NOISE VOLTAGE-BIASING AMPLIFIER FOR MAGNETORESISTIVE ELEMENT

[75] Inventors: Stephen A. Jove, Watsonville; Charles R. Nielsen; Calvin S. Nomura, both of San Jose, all of Calif.; Michael L. Workman, Rochester, Minn.

[73] Assignee: International Business Machines Corporation, Armonk, N.Y.

[21] Appl. No.: 648,675

[22] Filed: Jan. 13, 1991

[51] Int. Cl.$^5$ .................... G11B 5/02; G11B 5/127
[52] U.S. Cl. ................................ 360/67; 360/113
[58] Field of Search .............. 360/67, 113, 66, 68, 360/46; 324/252, 249; 330/60

[56] References Cited

U.S. PATENT DOCUMENTS

| | | | |
|---|---|---|---|
| 4,050,086 | 9/1977 | Harr | 360/66 |
| 4,706,138 | 11/1987 | Jove et al. | 360/67 |
| 4,712,144 | 12/1987 | Klaassen | 360/67 |
| 4,786,993 | 11/1988 | Jove et al. | 360/67 |
| 4,879,610 | 11/1989 | Jove et al. | 360/67 |
| 5,032,935 | 7/1991 | Jove et al. | 360/67 |
| 5,103,353 | 4/1992 | Jove et al. | 360/67 |
| 5,122,915 | 6/1992 | Klein et al. | 360/113 |

Primary Examiner—Robert J. Pascal
Assistant Examiner—Ali Neyzari
Attorney, Agent, or Firm—Henry E. Otto, Jr.

[57] ABSTRACT

A circuit for concurrently producing low noise electrical output signals which are amplified representations of signals produced by a magnetoresistive (MR) element and protecting said element from electrical short circuits which can occur between said element and its environment. A first feedback loop comprises (a) an input amplifier for amplifying a signal current from the MR element and (b) a source of bias current for biasing the MR element with a bias voltage. An input amplifier is concurrently biased by said current and amplifies a signal current from the MR element for producing a circuit output signal corresponding to dRh/RhRh and in which any differential direct current (dc) output offset error is minimized. (RhRh is the square of the time-averaged resistance of the MR element and dRh is the magnetic-signal-induced change in the resistance of the MR element.) A second feedback loop, electrically in series with the first feedback loop, biases the MR element toward a preselected reference potential and concurrently prevents flow of a current sufficient to damage the MR element in the event of a short circuit occurring between the MR element and its environment (e.g. the recording surface of a magnetic recording disk).

15 Claims, 2 Drawing Sheets

LOW NOISE VOLTAGE-BIASING AMPLIFIER FOR MAGNETORESISTIVE ELEMENT

This invention relates to circuits for amplifying signals produced by a magnetoresistive (MR) element, and more particularly to a disk file comprising low noise amplifier that voltage biases an MR element and provides short circuit protection to prevent large undesirable currents from flowing between the element and a surrounding environment in the event of the MR element contacting the surface of a disk.

BACKGROUND OF THE INVENTION

MR elements in the form of MR heads without center-taps are presently being used in disk file systems and are planned for many future disk drives. These MR heads have typically been biased with a current, and either a current or voltage has been used as the signal to be amplified. In addition, amplifiers have been designed to also reduce current from flowing through an electrical short which may sporadically occur between the air bearing surface of the MR head and the disk. The disk (which is typically grounded) and the head (which is in general at some other potential) will complete a circuit to allow a significant current to flow when this short occurs, unless the amplifier is designed to minimize the magnitude of the short-circuit current. Voltage biasing, under ideal conditions, yields the distinct advantage over current biasing of constant current density in the magnetoresistive stripe, thereby reducing the risk of electromigration.

U.S. Pat. No. 4,786,993 discloses an amplifier circuit that voltage biases an MR element, but has high noise and provides no short circuit protection.

Commonly assigned co-pending application U.S. Ser. No. 07/517 093 filed May 1, 1990 (now U.S. Pat. No. 5,103,353, granted Apr. 7, 1992 discloses an amplifier that provides both short circuit protection and has low noise; but the MR element is current-biased and produces an output signal corresponding to dRh/Rh, where Rh is the resistance of the MR element and dRh is the magnetic-signal-induced change in resistance of the MR element. While this circuit operates satisfactorily, it does not provide constant current density in the stripe of the MR element.

U.S. Pat. Nos. 4,706,138 and 4,879,160 disclose other amplifier circuits which current bias the MR element and provide either short circuit protection or low noise, but not both.

There is a need for an amplifier circuit that (i) voltage biases the MR element, (ii) provides a significantly improved signal/noise ratio with lower resistance MR elements, and (iii) provides short circuit protection.

SUMMARY OF THE INVENTION

Toward this end, and according to the invention, an amplifier circuit is disclosed for concurrently producing low noise electrical output signals which are amplified representations of signals produced by a magnetoresistive (MR) element and protecting said element from electrical short circuits which can occur between said element and its environment (e.g. the surface of a magnetic recording disk).

A first feedback loop comprises (a) an input amplifier for amplifying a signal current from the MR element and (b) a source of bias current for biasing the MR element with a bias voltage. An input amplifier is concurrently biased by said current and amplifies a signal current from the MR element for producing a circuit output signal corresponding to dRh/RhRh and in which any differential direct current (dc) output offset error is minimized. (RhRh is the square of the time-averaged resistance of the MR element and dRh is the magnetic-signal-induced change in the resistance of the MR element.)

A second feedback loop, electrically in series with the first feedback loop, biases the MR element toward a preselected reference potential and concurrently prevents flow of a current sufficient to damage the MR element in the event of a short circuit occurring between the MR element and its environment (e.g. the recording surface of a magnetic recording disk).

A feedforward signal preferably is applied to said first feedback loop to further minimize offset error. The output of the first feedback loop is at the common connection of the MR element and teh emitter of one of a pair of input bipolar transistors, and the second feedback loop has its output connected to the base of each of said transistors.

This circuit provides a signal/noise ratio with a net 4½ decibel (dB) improvement over the circuit in the above-cited U.S. Pat. No. 4,786,993 with a voltage-biased MR element, and up to a 5½ dB improvement over the circuit in the above-cited application with a current-biased MR element.

DESCRIPTION OF PREFERRED EMBODIMENT

Figure 1:
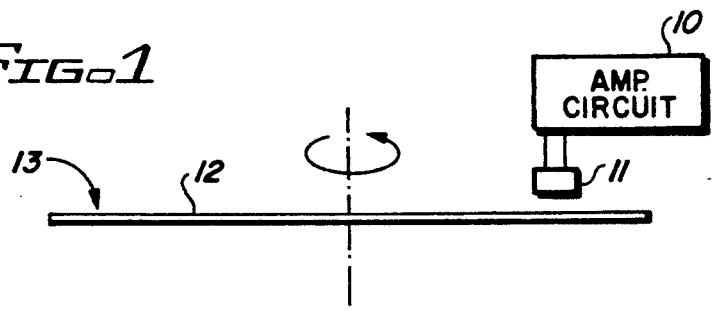
FIG. 1 is a schematic diagram, to exaggerated scale, of a portion of a disk file.

The amplifier circuit 10 embodying the invention comprises an MR element 11, such as an MR head, which is disposed in conventional fashion adjacent the air bearing surface 12 of a magnetic recording disk 13 of a disk file, as schematically shown in FIG. 1.

Figure 2:
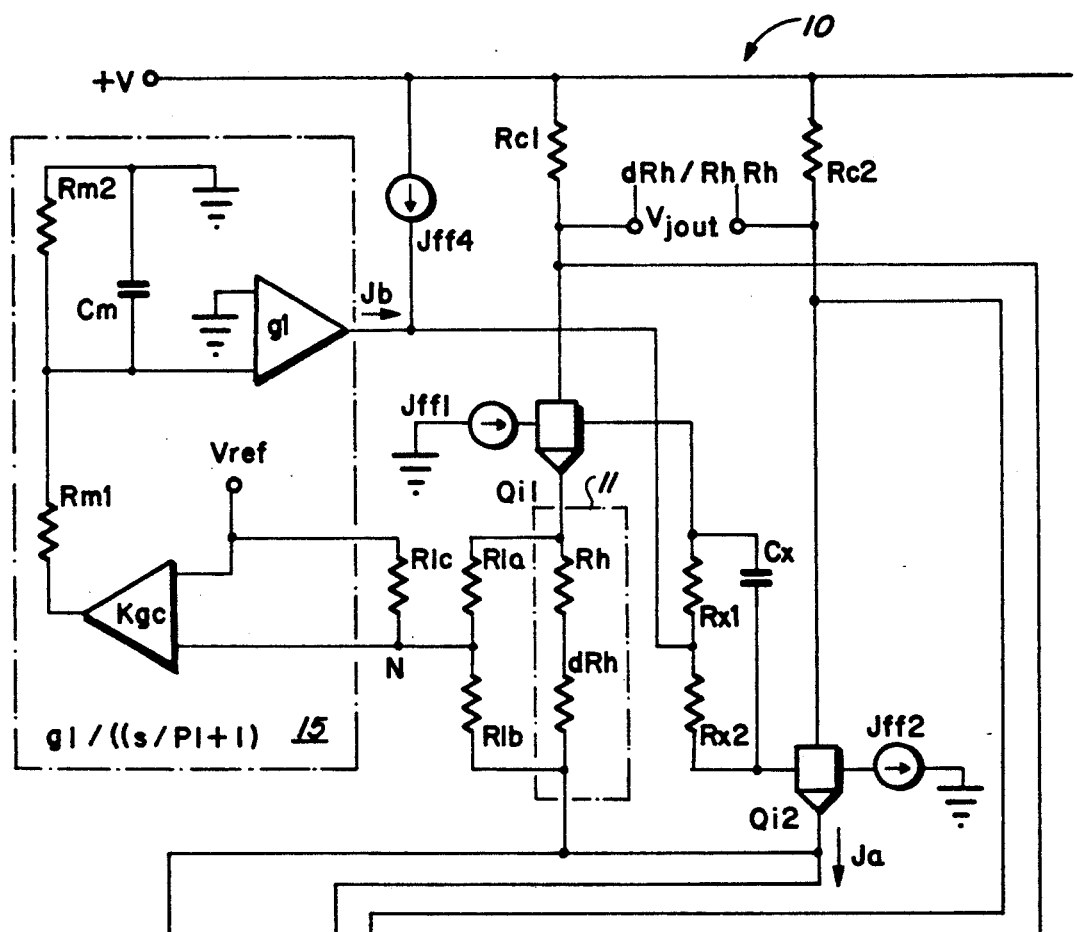
FIG. 2 is a schematic diagram of an amplifier circuit embodying the invention.
Figure 2:
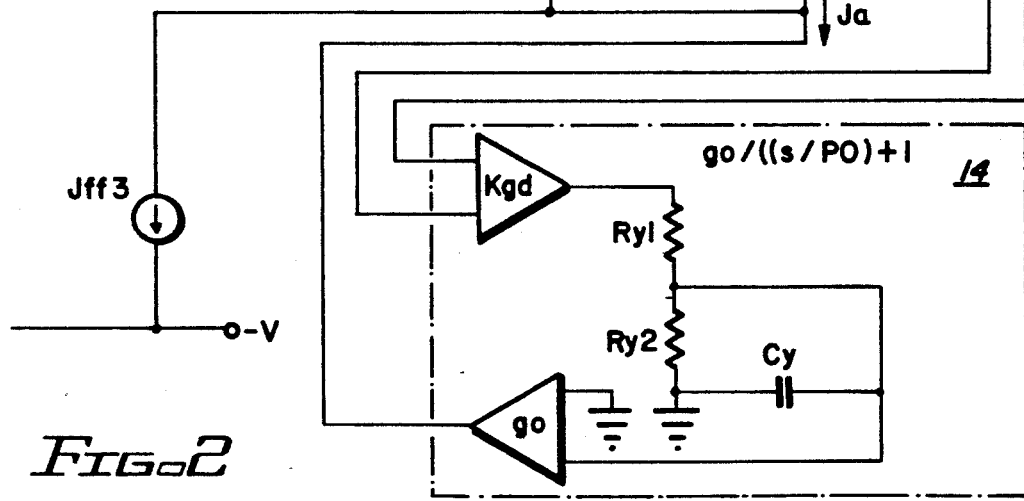

As illustrated in FIG. 2, the amplifier circuit 10 comprises two input bipolar transistors Qi1 and Qi2 whose emitters are connected to opposite terminals of the MR element 11, which has a time-averaged resistance Rh and a varying resistance dRh corresponding to the magnetic-signal-induced change in the resistance of the MR element Amplifier circuit 10 consists of two feedback loops 14 and 15.

Loop 14, which is a differential feedback loop, comprises a forward gain path and a reverse gain path. The forward gain path comprises input transistors Qi1 and Qi2 and associated collector resistors Rc1 and Rc2. The MR element 11 is connected to the input of the forward gain path of loop 14 at the emitters of the respective input transistors. Thus, the input has a low impedance and the forward gain is representative of a transimpedance with a signal voltage output across the collector resistors Rc1 and Rc2. In addition, a reference voltage is developed between the bases of the input transistors via currents Jff1 and Jff2 and resistors Rx1 and Rx2.

The reverse gain path (enclosed in broken lines) of loop 14 is an operational transconductance amplifier (OTA) $g_0$ with a dominant pole $P_0$ which takes the error voltage Vjout seen at the output of the forward gain path of the loop and applies a control current Ja to the emitter of input transistor Qi2, which is at the input of the forward gain path. This enables the input transistors to be biased at substantially equal currents Ja+Jff3, and simultaneously to bias the MR element with the above-mentioned reference voltage. A capacitor Cx between the bases of the input transistors eliminates noise from the reference voltage in the amplifier circuit. For minimum noise, the MR element and the input transistors should provide the only resistance in the input loop to the amplifier circuit Resistors Rx1 and Rx2 are fixed, and substantially equal; and Jff1 and Jff2 are substantially equal current sources. The signal output of the forward gain path associated with loop 14 is Vjout, which has a signal component represented by dRh/RhRh, and a dc offset component.

The reverse path of feedback loop 14 comprises a gain amplifier Kgd, an OTA $g_0$ and an R-C filter. The gain amplifier Kgd takes its two inputs from the collectors of the two bipolar input transistors Qi1 and Qi2. The output of amplifier Kgd is applied via an R-C filter to the input of OTA $g_0$. The output of OTA $g_0$ is connected to the emitter of input transistor Qi2 and also via the MR element to the emitter of input transistor Qi1. As illustrated, the R-C filter comprises a capacitor Cy and resistors Ry1 and Ry2.

This first feedback loop 14 minimizes the differential dc output offset error at Vjout by adjusting the amount of "tail" current present at the emitter of transistor Qi2 and, through the MR element 11, at the emitter of transistor Qi1. This first feedback loop insures that whatever reference voltage is applied between the bases of the input transistors will also be substantially applied across the MR element. Hence, the MR element can be voltage biased, while minimizing output offset. Source Jff3 adjusts a feedforward current for nominal conditions to further minimize the output offset; and the "tail" current generated by OTA $g_0$ is allowed to change in response to various steady-state resistances of the MR element 11 (or of each MR element if multiple elements are used).

Thus, first feedback loop 14, in conjunction with feedforward current Jff3, provides sufficient "tail" current to the emitters of both input transistors Qi1 and Qi2 to cause the voltage generated across the MR element to be substantially the same as the reference voltage generated across the bases of said transistors. By minimizing dc output offset, the first feedback loop insures substantially equal current through each input transistor Qi1 and Qi2.

The function of the first feedback loop 14 may be expressed as $g_0/(s/P_0+1)$ where $g_0$ is the total gain of the feedback portion of said loop, s is the La Place operator, and $P_0$ is the dominant pole of said loop. The R-C filter is necessary to produce dominant pole $P_0$, which is needed to insure loop stability.

The second feedback loop 15 also comprises a forward and a reverse gain path. The reverse gain path of loop 15 also comprises an OTA g1 with a dominant pole P1. The input to the reverse gain path of loop 15 is at the electrical center N of the MR element which is derived from substantially identical resistors R1a and R1b. An error voltage is then derived via resistor R1c. The error voltage is substantially reduced by loop 15 which applies a control current equally to the bases of both input transistors Qi1 and Qi2 at the output of the reverse gain path. The forward gain path (enclosed in broken lines) is merely the base-to-emitter circuit of both input transistors, with associated current gain $\beta$, with the input at its respective bases and the output at its respective emitters.

This insures that the electrical center of the MR element will be held at a prescribed voltage level determined by Vref, since the combined emitter currents of both input transistors Qi1 and Qi2 are controlled via their respective base currents to the value of current required by the output of loop 14 and feedforward current Jff3. Also, this insures that if an electrical short circuit of finite duration occurs between the MR element 11 and environment (12), very little current will be allowed to flow through the short circuit.

To explain this, assume that steady state has been attained by all loops when a short circuit occurs somewhere between the MR stripe and the disk 13. The disk is at some potential Vref, and the electrical center N of the MR element 11 is also controlled to substantially Vref in steady state. The result of the short circuit to Vref from a point other than the electrical center of the MR element will result in an error voltage being developed at the input of loop 15. Since the dominant pole of loop 15 is made intentionally slow with respect to the allowable finite time duration of such a short circuit, it cannot respond to this error signal immediately; so the control current output of loop 15 will remain essentially unchanged during the entire duration of the short circuit occurrence.

Since the control current output of loop 15 will be essentially the same for both steady state operation and operation for a short circuit of finite duration, the combined emitter currents of both input transistors will remain unchanged.

Since loop 14 has not changed its requirement for current at its output, no current will be available to pass through the short circuit from the MR element 11 to the disk 13.

The forward gain path of the second feedback loop comprises a gain amplifier Kgc, an OTA g1 and an R-C filter. As illustrated, the R-C filter comprises resistors Rm1 and Rm2 and capacitor Cm. The amplifier Kgc has one input connected directly to the reference voltage Vref and the other input connected to the electrical center of the MR element. The output of gain amplifier Kgc is applied to the input of the R-C filter whose output is connected to OTA g1. The output of stage g1 is connected to the bases of input transistors Qi1 and Qi2 via substantially identical resistors Rx1 and Rx2.

The second loop 15, which is a "common mode" feedback loop, thus regulates the bias currents to the bases of the input transistors Qi1 and Qi2 and thereby insures that the MR element is maintained substantially at a prescribed common mode potential Vref to provide short circuit protection. This second loop receives an error signal which is the potential difference between the electrical center N of the MR element and the reference potential Vref across resistor R1c. Substantially identical resistors R1a and R1b are used to derive the potential at the electrical center N of the MR element. Node N at the common connection of resistors R1a, R1b, R1c contains the error signal for the second feedback loop.

As earlier stated, the output of this second feedback loop from OTA g1 provides base current for the input transistors at the common connection of resistors Rx1 and Rx2; and the base current of each transistor Qi1 and Qi2, multiplied by the respective current gain $\beta$, is made substantially equal to the total "tail" current required by the output of OTA $g_0$ of the first feedback loop and the feedforward current Jff3.

According to features of the invention, feedforward current Jff3 is also included to minimize the error signal at Vjout by eliminating mean shift; and feedforward current Jff4 is included to minimize the error signal at node N by eliminating mean shift.

The function of the forward gain path of this second feedback loop may be expressed as $g1/(s/P1+1)$, where g1 is the total gain of the feedback portion of said loop, and P1 is the dominant pole of that loop.

Derivation of Equations Relating to Forward Gain Transfer Function and Short Circuit Protection Assume initially that the input signal generated by the MR element can be considered as a voltage source in series with a fixed resistor representing the steady-state (or dc) resistance of the magnetoresistive sensor. This is approximately true because this signal voltage $V_{in}$ is, in effect, the result of a signal resistance dRh multiplied by a bias current $I_{bias}$, where this bias current equals the bias voltage $V_{bias}$ divided by the MR element terminal resistance Rh. The following equation then represents the transfer function which is the ratio of output voltage to input voltage in the circuit of FIG. 2:

$$V_{out}/V_{in} = (As^2 + Bs + C)/(Ds^2 + Es + F) \quad (1)$$

where s, as heretofore stated, is the La Place operator. The coefficients are defined as:
$A = 4\alpha R_c R_x (C_x/P_0)$
$B = 2\alpha R_c [2R_x C_x + (1/P_0)]$
$C = 2\alpha R_c$
$D = 2R_x(C_x/P_0)(Rh + 2r_e + 2(R_{bb}/\beta))$
$E = (1/P_0)[Rh(1 + \alpha R_0 g_0) + 2(r_e + (r_{bb}/\beta) + (R_x/\beta))] + [2R_x C_x(Rh + 2r_e + 2(r_{bb}/\beta))]$
$F = Rh(1 + \alpha R_0 g_0) + 2(r_e + (r_{bb}/\beta) + (R_x/\beta))$ In the above expression for the voltage transfer function, feedforward source $J_{ff3}$ is not included; sources $J_{ff1}$, $J_{ff2}$ are assumed substantially similar; and the second feedback loop is assumed not to substantially contribute to the forward gain response. These are all valid assumptions according to circuit simulation results done with reasonably chosen device/parameter values.

In the above formulas, Rx is Rx1+Rx2; $\alpha$ is the ratio of collector to emitter current; $R_c$ is the resistance of either collector resistor; $r_e$ is the resistance of the active emitter of the input transistors; and $r_{bb}$ is the equivalent base spreading resistance of the input transistors. In addition, given that the pole associated with the first differential feedback loop is $P_0$, and the voltage gain Kgd in conjunction with the resistor divider of resistors $R_y$ is made unity, then the loop gain becomes only a function of OTA $g_0$; and this loop can be modelled for simplicity in the above equations as:

$$g_0/[(s/P_0) + 1] \quad (2)$$

For the midband gain of the amplifier, let $s = \infty$ in the above voltage transfer function, and assume that the input signal voltage is represented by:

$$V_i = (dRh V_{bias}/Rh) \quad (3)$$

where $V_{bias}$ is the voltage applied between the bases of the input transistors Qi1 and Qi2. Then the output signal voltage $V_{jout}$ can be expressed as:

$$V_{jout} = [dRh 2\alpha R_c V_{bias}/Rh(Rh + 2r_e + 2(r_{bb}/\beta))] \quad (4)$$

Since the resistance $r_e$ of the active emitter and the equivalent base spreading resistance $r_{bb}$ of the input transistors is, in general, much smaller than the steady-state value of MR element resistance $R_h$, the denominator of Equation (4) for output signal voltage can be approximated as $Rh^2$ or RhRh If the numerator is then shown as dRh multiplied by the constant $K = 2\alpha R_c V_{bias}$, then the expression for $V_{jout}$ becomes, for the input signal current sensed by this amplifier:

$$V_{jout} = (KdRh)/(RhRh) \quad (5)$$

In the first expression for the forward gain transfer function of the circuit of FIG. 2, the numerator and denominator are both quadratic. In practice, the amplifier should have only one dominant pole in the forward gain transfer function for stability. Therefore, if this ratio of quadratic polynomials is factored as:

$$V_{jout} = [(s+Z_a)(s+Z_b)]/[(s+P_a)(S+P_b)] \quad (6)$$

and if $Z_b$ and $P_b$ are chosen to be very low in frequency (much lower than the frequency of $Z_a$) and very close to each other, effectively cancelling each other, the resultant transfer function can be approximated by $$V_{jout} = (s+Z_a)/(s+P_a) \quad (7)$$

Figure 3:
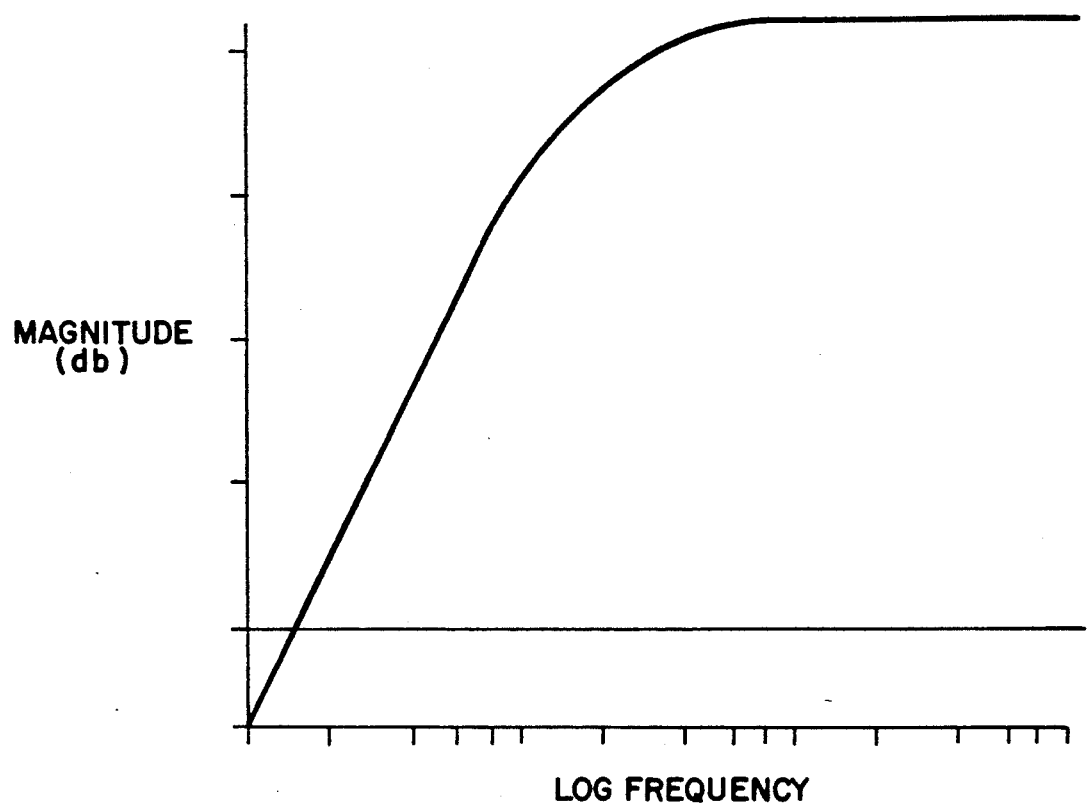
FIG. 3 is a Bode plot of frequency response done by computer simulation, showing the characteristic single dominant low-frequency rolloff.

Now if the zero $Z_a$ is made lower in frequency than the pole $P_a$, the result is a lower frequency response which has a first dominant zero at a low frequency $f_z$ and a dominant pole at a higher frequency $f_p$. This has a high pass characteristic with a lower rolloff frequency at the dominant pole, and a non-zero gain to direct current. With proper selection of parameter values A, B, C, D, E and F, for Equation (1), this can be achieved with the proposed circuit of FIG. 2, as shown in the Bode plot of FIG. 3 done by computer simulation. FIG. 3 represents a high pass characteristic with the pole-zero cancellation at a very low frequency (much lower than the dominant zero).

As stated previously, the high frequency rolloff of this amplifier may be dominated by the total series inductance of the input loop, and is described as $$f_{-3db} = (R_i)/(2\pi L_i) \quad (8)$$

where $L_i$ is differential series inductance of the leads from the MR element to the amplifier input, and $R_i$ is the sum of the resistances around the input loop $(R_i = Rh + 2r_e + 2r_{bb}\beta^{-1})$.

Short circuit protection is provided by the second feedback loop (FIG. 2) containing OTA g1. The time constant of this loop is kept substantially slow (as in the prior art) to prevent the loop from immediately reacting to a common-mode disturbance near the MR element, such as a short circuit to ground. In addition to holding the MR element at substantially the same potential as Vref, the topology surrounding the base circuit of the input transistors allows the bases to "float" to any convenient potential when a short circuit occurs from a point on the MR element to some potential $V_{short}$. The MR element, when biased on, has a bias voltage $V_{bias}$ applied across the magnetoresistive stripe.

In a disk file system, the disk would logically be placed at the reference potential $V_{ref}$. Each point along the stripe near the air-bearing surface or of the disk in this system would then have a voltage associated with it relative to $V_{ref}$. In the steady state, the second feedback loop keeps the electrical center of the MR stripe substantially at $V_{ref}$, within a certain error, which is the steady-state error $V_{error}$ associated with this loop and modified by the feedforward current $J_{ff4}$.

Just before a short circuit occurs between some arbitrary point along the magnetoresistive stripe and the disk, the difference in potential between this point on the stripe and the reference potential can be calculated as $$\delta V = V_{error} - K V_{bias} \qquad (9)$$

where K is related to the actual position of the shorting point on the magnetoresistive stripe and can vary from $-\frac{1}{2}$ to $+\frac{1}{2}$, and the error voltage $V_{error}$ can be either positive or negative. At the onset of the short circuit, no loops can instantaneously respond and the initial value of short circuit current from MR element to the disk is described as $$i_s = \delta V / R_{short} \qquad (10)$$

where $R_{short}$ is the resistance associated with the short circuit from any arbitrary point on the magnetoresistive stripe to the disk.

The first transient occurrence after this initial short circuit current is the charging or discharging of any parasitic capacitances associated with either the base circuit of the input transistors, or the emitter circuit where the MR element is connected. Since the base circuit was allowed to "float" in a common-mode sense, the parasitic capacitances $C_p$ in the base circuit must nearly instantaneously change their voltage because of the change in the common-mode voltage in the emitter circuit due to the short circuit. These parasitic capacitances include the base-to-collector capacitances, the base-to-emitter junction capacitances and any parasitic capacitances related to the wiring of $C_x$. These base parasitic capacitances must discharge through the emitters of the input transistors and therefore are essentially multiplied by the current gain $\beta$ of the transistors. Thus, they represent the largest component of this initial transient. The remaining emitter parasitic capacitances which include the capacitance associated with wiring the MR element to the amplifier are far less dominant in practice. This initial (fast) transient short circuit current can be described as $$i_{s1}(t) = i_s e^{(-t/2RC)} \qquad (11)$$

where $R = R_{short} + r_e + (r_{bb}/\beta)$, and $C = \beta C_p$

After the parasitic capacitances have been allowed to adjust their voltage and the base circuit is allowed to 'float' to the new potential defined by $\delta V$, the loops will slowly begin to respond to the disturbance caused by the short circuit. Since the first feedback loop determines the low frequency rolloff of the forward gain path in the amplifier, the time constant $\tau_0$ will be higher than the time constant of the second feedback loop $\tau_1$. Therefore the faster loop will follow the slower loop (analogous to two time constants in series). In practice, the parasitic capacitance $C_p$ will be relatively small, and the time constant associated with the second feedback loop $\tau_1$ will be relatively slow, so the response associated with $I_{s1}(t)$ will essentially be terminated before the response associated with the loops has begun.

Figure 4:
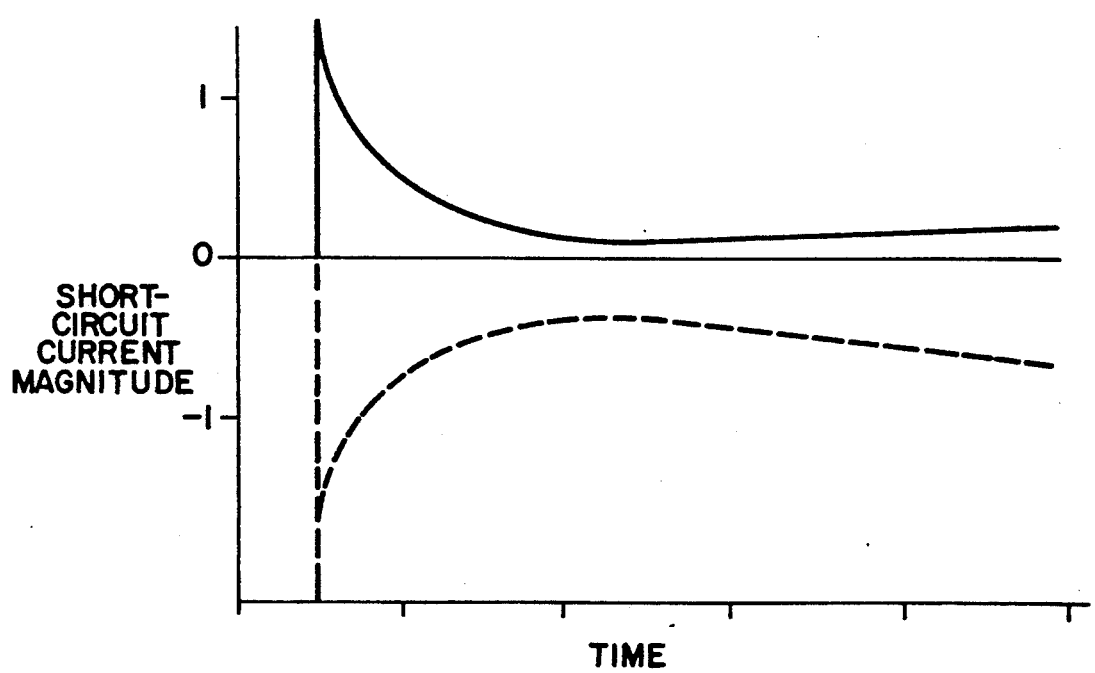
FIG. 4 is a short circuit profile between the MR element and the environment by computer simulation.

The short circuit current response associated with the responding feedback loops can be approximated as $$i_{s2}(t) = (\delta V \beta g_1/(2+\beta R_1 g_1))[1 - e^{((-t/2(\tau/(2+\beta R_g)))}] \qquad (12)$$

where the resultant short circuit profile is the sum of the above short circuit profiles and is calculated as $$i_s(t) = i_{s1}(t) = i_{s2}(t) \qquad (13)$$

and shown in FIG. 4 from circuit simulation.

In FIG. 4, two plots are shown. The upper plot represents shorting the MR element at the most positive terminal (with corresponding current direction into $V_{short}$), and the bottom plot represents shorting the MR element at the most negative terminal (with corresponding current direction out of $V_{short}$). In practice, the shorting is allowed only to occur during a prescribed (and relatively brief) time period which is depicted in FIG. 4, where the final value of short circuit current is never attained. If, however, the final value is allowed to be reached (as with a short circuit of infinite duration), than it can be calculated from the above equations that this final value of short circuit current can be kept reasonably low.

It will be apparent from the foregoing equations that the degree of short circuit protection increases as the difference between the reference potential and that of the environment decreases, and vice versa; and that the degree of short circuit protection increases as the bias voltage decreases, and vice versa.

While the invention has been shown and described with respect to a preferred embodiment thereof, it will be understood by those skilled in the art that changes in form and detail may be made in this embodiment without departing from the scope and teaching of the invention. Accordingly, the apparatus and method herein disclosed are to be considered merely as illustrative, and the invention is to be limited only as specified in the claims.

We claim:

1. A circuit for producing low noise electrical output signals which are amplified representations of signals produced by a magnetoresistive (MR) element, said circuit comprising:
    a first feedback loop (14) comprising (a) a source of bias current (Ja+Jff3) for biasing the MR element with a bias voltage (Jff1 or Jff2)(Rx1+Rx2) and (b) an input amplifier (Qi1, Qi2, Rc1, Rc2) that is biased by said current and amplifies a signal current ((Jff1 or Jff2)(Rx1+Rx2)/dRh) from the MR element for producing a circuit output signal corresponding to dRh/RhRh, where said RhRh is the square of the time-averaged resistance of the MR element and said dRh is the magnetic-signal-induced change in the resistance of the MR element.

2. The circuit of claim 1, including
    said MR element;
    a pair of bipolar input transistors (Qi1, Qi2) having their emitters connected to opposite ends of the MR element; and an operational transconductance amplifier (g0) for said first feedback loop to provide a control current for simultaneously providing said bias current to said input transistors and to said MR element such that said control current changes to provide a prescribed bias voltage across said MR element in response to variations in steady-state resistances (Rh).

3. A circuit for concurrently producing low noise electrical output signals which are amplified representations of signals produced by a magnetoresistive (MR) element (11) and protecting said element from electrical short circuits which can occur between said element and its environment, said circuit comprising:

a first feedback loop (14) comprising (a) a source of bias current (Ja+Jff3) for biasing the MR element with a bias voltage (Jff1 or Jff2)(Rx1+Rx2) and (b) an input amplifier (Qi1, Qi2, Rc1, Rc2) that is biased by said current and amplifies a signal current ((Jff1 or Jff2)(Rx1+Rx2)/dRh) from the MR element for producing a circuit output signal corresponding to dRh/RhRh and having minimal differential dc output offset error, where said RhRh is the square of the time-averaged resistance of the MR element and said dRh is the magnetic-signal-induced change in the resistance of the MR element; and a second feedback loop (15), electrically in series with the first feedback loop, for biasing the MR element toward a preselected reference potential (Vref) for minimizing the difference in potential between an electrical center of the MR element and said preselected reference potential, and concurrently preventing flow of a current sufficient to damage the MR element in the event of a short circuit occurring between the MR element and its environment.

4. The circuit of claim 3, wherein said bias current includes a feedforward current (Jff3) to further minimize said offset error.

5. The circuit of claim 3, wherein the input amplifier comprises a pair of input bipolar transistors (Qi1, Qi2), said first feedback loop having its output at the common connection of one terminal of the MR element and the emitter of one of said input transistors and, through the other terminal of the MR element, to the emitter of the other of said input transistors, and said second feedback loop having its output connected to the base of each of said input transistors.

6. The circuit of claim 3, including:
said MR element, said MR element having two terminals; and
a pair of input bipolar transistors having their respective emitters connected to opposite terminals of the MR element, for minimizing circuit noise and sensing said signal current.

7. The circuit of claim 3, wherein the degree of short circuit protection increases as the difference between the reference potential and that of the environment decreases, and vice versa.

8. The circuit of claim 3, wherein the degree of short circuit protection increases as the bias voltage decreases, and vice versa.

9. The circuit of claim 3, including an operational transconductance amplifier (g0, g1) in each feedback loop for converting an error voltage to a control current output (Ja, Jb).

10. The circuit of claim 5, wherein said bias current includes a feedforward current (Jff3) at the common connection of the emitter of one of said input bipolar transistors and one of the said terminals of said MR element, for the purpose of statistically minimizing dc output offset by eliminating mean shift.

11. The circuit of claim 5, including means for applying a feedforward current (Jff4) at the bases of both of said input transistors for the purpose of statistically minimizing dc output offset at the electrical center of the MR element.

12. A circuit for concurrently producing low noise electrical output signals which are amplified representations of signals produced by a magnetoresistive (MR) element (11) and protecting said element from electrical short circuits which can occur between said element and its environment, said circuit comprising:

a first feedback loop comprising a forward gain path and a reverse gain path;

said forward gain path including means for applying a bias voltage across the MR element, and means for converting an input signal current representing the bias voltage divided by dRh into an output signal voltage represented by dRh/RhRh, where said RhRh is the square of the time-averaged resistance of the MR element and said dRh is the magnetic-signal-induced change in the resistance of the MR element; and said reverse gain path including an operational transconductance amplifier (OTA) (g0) with a dominant low-frequency pole (P0) for biasing the forward gain path with a bias current (Ja) which minimizes dc offset error of the forward gain path (at $V_{jout}$) and concurrently biases the MR element with the bias voltage.

13. The circuit of claim 12, including:
a second feedback loop comprising a forward gain path and a reverse gain path;
said forward gain path comprising an OTA (g1) with a dominant low-frequency pole (P1) for biasing the reverse gain path (Qi1, Qi2, Rx1, Rx2) of said second feedback loop with a bias current (Jb) that minimizes any short circuit current that may be developed between the MR element and an environment (12) which is at a preselected reference potential (Vref); and
said reverse gain path comprising means for converting the output of the forward gain path of said second feedback loop into an error voltage representing the difference between the potential at an electrical center of the MR element and said environment.

14. A magnetic recording disk file comprising:
a rotatable magnetic recording disk;
a magnetoresistive (MR) element supported proximate the disk for sensing magneto transitions on the disk; and
a circuit including the MR element for producing low noise electrical output signals which are amplified representations of signals produced by the MR element, said circuit further including:
an input amplifier; and
means, including a first feedback loop, providing a common bias current both for biasing the MR element with a bias voltage and for concurrently biasing the input amplifier, said amplifier being operative to amplify a signal current from the MR element to produce a circuit output signal corresponding to dRh/RhRh and having minimal differential dc output offset error, where said RhRh is the square of the time-averaged resistance of the MR element and said dRh is the magnetic-signal-induced change in the resistance of the MR element.

15. The disk file of claim 14, wherein said circuit includes:
   a second feedback loop, electrically in series with the first feedback loop, for biasing said MR element toward a preselected reference potential which is substantially equal to that of the disk and concurrently preventing flow of a current sufficient to damage said MR element in the event of a short circuit occurring between said MR element and the disk.

* * * * *

UNITED STATES PATENT AND TRADEMARK OFFICE
CERTIFICATE OF CORRECTION

PATENT NO. : 5,204,789
DATED : Apr. 20, 1993
INVENTOR(S) : Stephen A. Jove et al.

It is certified that error appears in the above-identified patent and that said Letters Patent is hereby corrected as shown below:

On the title page:

First column; after Filed: delete "Jan. 13, 1991"
insert -- Jan. 31, 1991 --

Column 6, formula (8), line 52: delete "$f_{-3db}$"
insert --$f_{-3dB}$--

Column 8, formula (12), line 8: delete "$\tau/(2+\beta R_s)))$"
insert: --$\tau_1/(2+\beta R_1 g_1)))$--

Signed and Sealed this

Thirtieth Day of November, 1993

Attest:

BRUCE LEHMAN

Attesting Officer

Commissioner of Patents and Trademarks